(12) United States Patent
Chien

(10) Patent No.: US 8,116,418 B2
(45) Date of Patent: Feb. 14, 2012

(54) FAST LOCKING CLOCK AND DATA RECOVERY

(75) Inventor: Jinn-Yeh Chien, Chu Bei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 815 days.

(21) Appl. No.: 12/184,123

(22) Filed: Jul. 31, 2008

(65) Prior Publication Data

US 2009/0279655 A1  Nov. 12, 2009

Related U.S. Application Data

(60) Provisional application No. 61/051,551, filed on May 8, 2008.

(51) Int. Cl.
*H03D 3/24* (2006.01)

(52) U.S. Cl. ........ 375/373; 375/316; 375/324; 375/340; 375/342; 375/346; 375/349; 375/351; 375/354; 375/362; 375/371; 375/372; 375/374; 375/376; 327/107

(58) Field of Classification Search .................. 375/316, 375/324, 340, 342, 349, 351, 354, 362, 371–374, 375/376; 327/107
See application file for complete search history.

(56) References Cited

U.S. PATENT DOCUMENTS

| | | | | |
|---|---|---|---|---|
| 6,801,066 B2* | 10/2004 | Lee | | 327/119 |
| 6,993,105 B1* | 1/2006 | Little et al. | | 375/360 |
| 7,194,057 B2* | 3/2007 | Lin | | 375/375 |
| 7,323,917 B2* | 1/2008 | Cho et al. | | 327/158 |
| 7,330,059 B2* | 2/2008 | Tai et al. | | 327/158 |
| 7,697,651 B2* | 4/2010 | Abhayagunawardhana et al. | | 375/373 |
| 7,848,473 B2* | 12/2010 | Freyman et al. | | 375/362 |
| 2008/0137790 A1* | 6/2008 | Cranford et al. | | 375/357 |

* cited by examiner

*Primary Examiner* — Chieh M Fan
*Assistant Examiner* — Sophia Vlahos
(74) *Attorney, Agent, or Firm* — K&L Gates LLP

(57) ABSTRACT

A clock data recovery comprises a phase detector, a phase interpolator, an initial phase detector, and an initial phase decoder. The phase detector receives an incoming data stream and an interpolated clock signal and output an early/late value indicating timing relationship between the incoming data stream and the interpolated clock signal. The phase interpolator receives the early/late signal and at least one reference clock signal and generate an interpolated clock signal considering the early/late value and the at least one reference clock signal. The initial phase detector receives the incoming data stream and output a first data indicating a phase of the incoming data stream. The initial phase decoder receives data indicating a phase of the incoming data stream and select the at least one reference clock signal from a plurality of clock signals considering the data indicating a phase of the incoming data stream.

14 Claims, 7 Drawing Sheets

FAST LOCKING CLOCK AND DATA RECOVERY

PRIORITY DATA

The present invention claims priority to provisional patent application No. 61/051,551 filed May 8, 2008.

BACKGROUND

Various embodiments relate to fast-locking clock and data recovery (CDR) methods and circuits that may be used, for example, in digital communications.

To read an incoming digital data stream, it is necessary to have a clock signal that is in phase with the incoming data stream. Such a clock signal indicates to the receiving component when it should sample the incoming stream to capture the values encoded therein. This clock signal may be provided to the receiving component over a separate clock transmission channel (e.g., a wire or other conductive path, a wireless channel, etc.). According to CDR methods, however, the clock signal is derived directly from the incoming data stream, which may eliminate the need for the separate clock transmission channel.

One type of CDR circuit is a Phase Interpolation (PI) CDR circuit. In a PI CDR circuit, the clock output is generated by taking a weighted phase interpolation of two quadrature reference clock signals (i.e., clock signals separated in phase by about $\pi/2$). FIG. 1 illustrates a prior art PI CDR circuit 100. The circuit 100 comprises a phase detector 102 and a phase interpolator 104. The phase detector 102 receives an incoming data stream via preamplifier 110, and an interpolated clock signal, received from the phase interpolator 104. The outputs of the phase detector 102 include an early value and a late value. The early value is asserted if the phase of the incoming data stream is early relative to the interpolated clock signal, and the late value is asserted if the incoming data stream is late relative to the interpolated clock signal.

The phase interpolator 104 comprises a phase interpolator controller 108 and a phase interpolator core 106. The controller 108 receives the early and late values from the phase detector 102 and generates a series of phase tuning values that are provided to the core 106. The core 106 receives the tuning values, as well as the two quadrature reference clock signals, Clock I and Clock Q. The core 106 performs a phase interpolation between Clock I and Clock Q. The weighting given to the phase of each of the Clocks I and Q is determined by the tuning values. The result is the interpolated clock signal, which is provided to the phase detector 102 as described above. The interpolated clock and the incoming data stream are provided as output via an output buffer 112.

When the phase of the incoming data stream and that of the interpolated clock do not match (i.e., when either the early value or the late value is asserted), the phase interpolator 104 incrementally modifies the phase of the interpolated clock until it locks onto the phase of the incoming data stream. When the early value or the late value is asserted, the controller 108 may modify the tuning values, which in turn modifies the weighting given to Clocks I and/or Q by the core 106 and causes the phase of the interpolated clock to be incremented, or decremented, by a predetermined amount. FIG. 2 illustrates a timing plot 200 generated by the PI CDR circuit 100. The plot 200 illustrates an incoming data incoming data stream 202, an interpolated clock signal 204, Clock I, and Clock Q. The incoming data stream 202 is initially early relative to the interpolated clock. With each rising edge of the incoming data stream 202, the early value of the phase detector 102 is set, causing the controller 108 to modify the weighting given to the Clock I and Clock Q. As a result, the core 106 increments the phase of the interpolated clock toward that of the incoming data stream 202. The number of steps necessary for the interpolated clock signal 204 to lock at the phase of the incoming data stream is determined by the phase resolution of the circuit 100 and the initial phase difference between the interpolated clock signal 204 and the incoming data stream 202.

FIGURES

Embodiments of the present invention are described herein, by way of example, in conjunction with the following figures, wherein.

SUMMARY

In one general aspect, various embodiments of the invention are directed to a clock data recovery system. The system may comprise a phase detector, a phase interpolator, an initial phase detector, and an initial phase decoder. The initial phase detector may be configured to receive an incoming data stream and an interpolated clock signal and output an early/late value indicating whether the incoming data stream is early or late relative to the interpolated clock signal. The phase interpolator may be configured to receive the early/late signal and at least one reference clock signal and generate an interpolated clock signal considering the early/late value and the at least one reference clock signal. The initial phase detector may be configured to receive the incoming data stream and output first data indicating a phase of the incoming data stream. The initial phase decoder may be configured to receive data indicating a phase of the incoming data stream and select the at least one reference clock signal from a plurality of clock signals considering the data indicating a phase of the incoming data stream, where the data indicating the phase of the incoming data stream comprises the first data. Also, the initial phase detector and the initial phase decoder may be configured to deactivate after the at least one reference clock signal is selected.

In another general aspect, various embodiments of the invention are directed to methods for clock data recovery. The methods may comprise receiving an incoming data stream and generating an early/late value indicating whether the incoming data stream is early or late relative to the interpolated clock signal. The methods may also comprise deriving from the incoming data stream first data indicating a phase of the incoming data stream and selecting at least one reference clock signal from a plurality of clock signals considering the first data. In addition, the methods may comprise generating an interpolated clock signal considering the at least one reference clock signal, and the early/late value, and deactivating at least one hardware component configured to derive the first data, and at least one hardware component configured to select the at least one reference clock signal.

DESCRIPTION

Various embodiments are directed to Phase Interpolation (PI) Clock and Data Recovery (CDR) circuits including functionality for selecting an initial reference clock signal or signals based on the phase of the incoming data stream. In various embodiments, this may reduce the number of times that the interpolated clock signal is incremented prior to locking, therefore reducing the locking time. The PI CDR circuits and methods described herein may be utilized in any application where CDR circuits are desirable, including, for example, high-speed serial communications applications utilizing protocols such as HYPER TRANSFER, SERIAL-ATA, PCT EXPRESS, etc.

Figure 1:
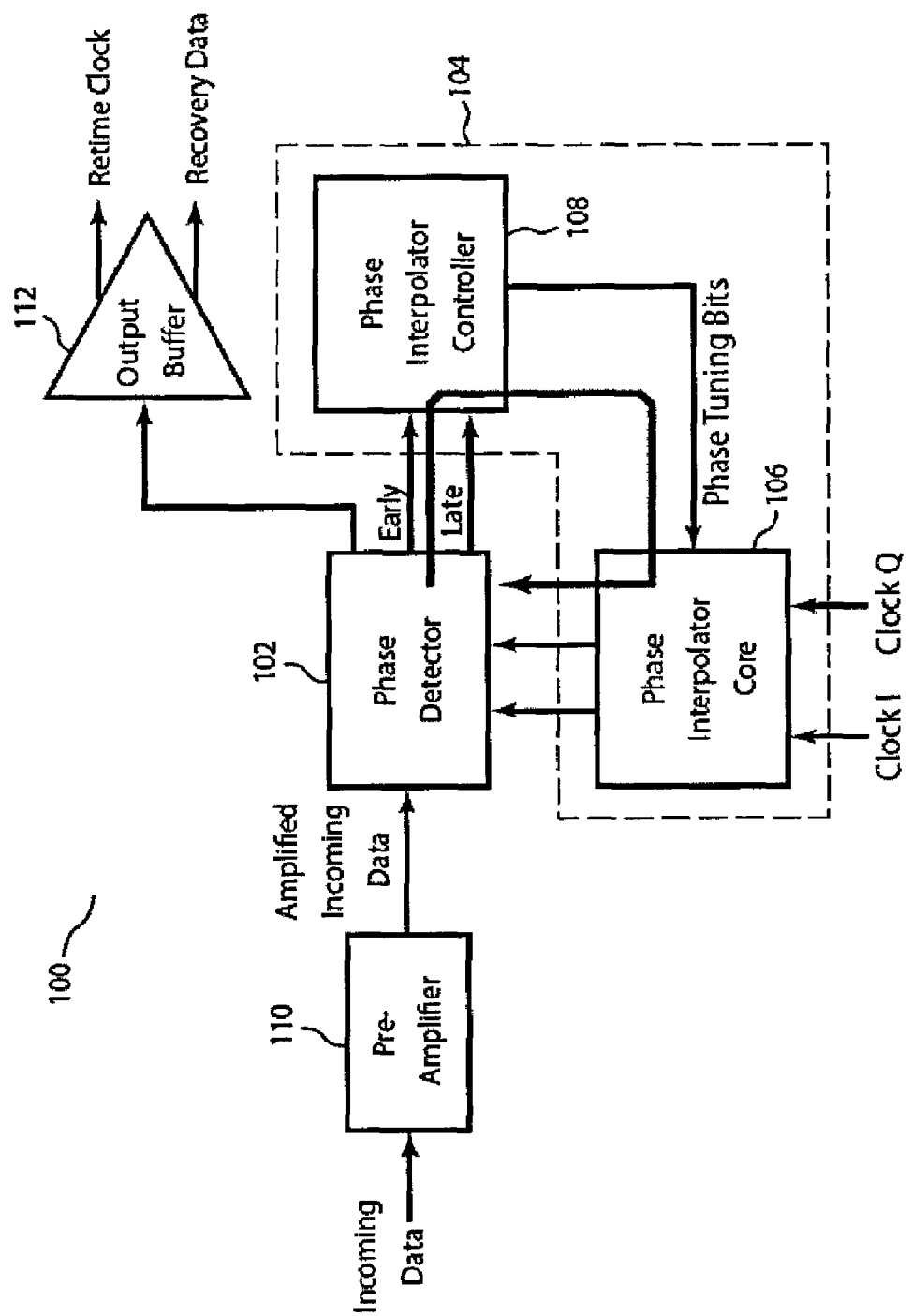
FIG. 1 illustrates a prior art Phase Interpolation (PI) Clock and Data Recovery (CDR) circuit.
Figure 2:
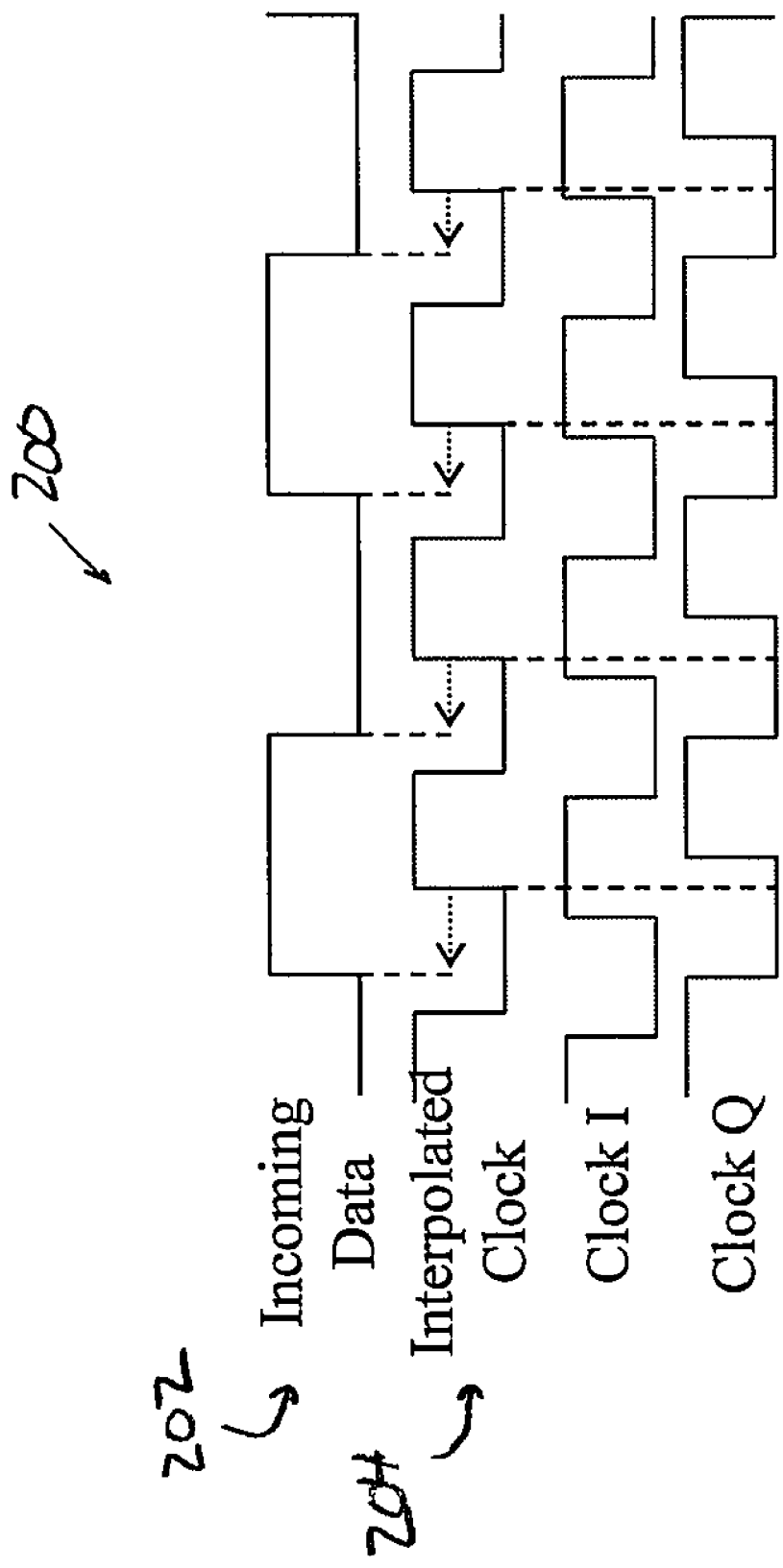
FIG. 2 illustrates a timing plot generated by the PI CDR circuit of FIG. 1.
Figure 3B:
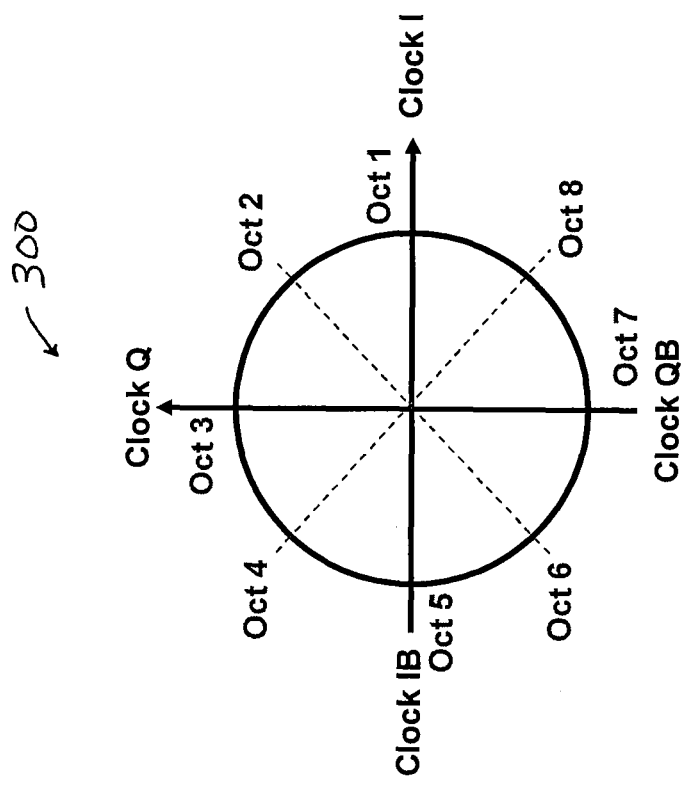
FIG. 3B illustrates one embodiment of the phasor diagram showing Octants.
Figure 3A:
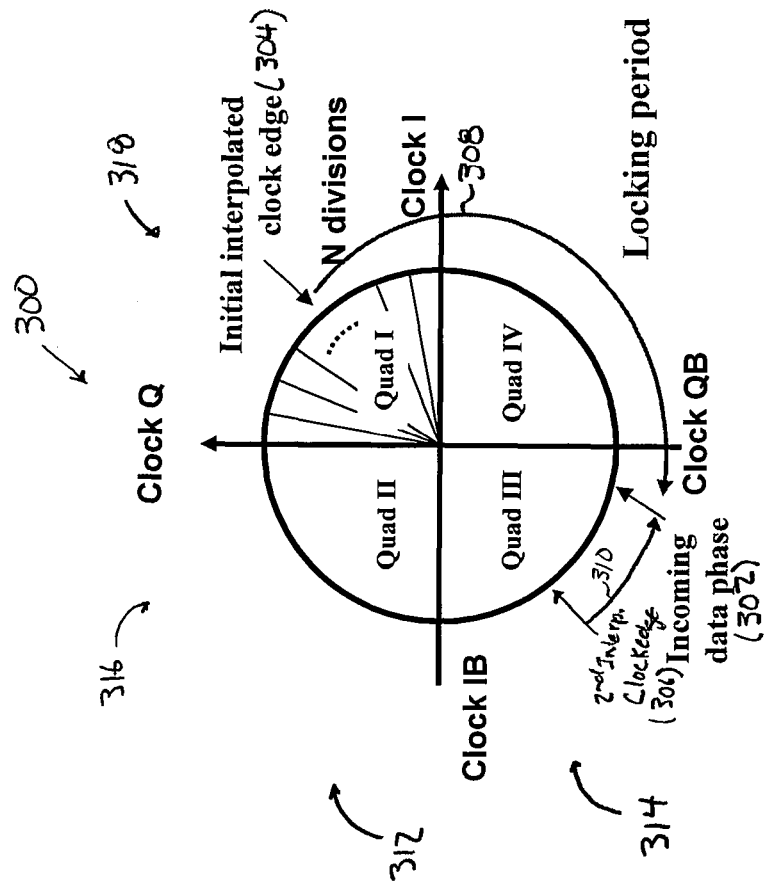
FIG. 3A illustrates a phasor diagram showing the operation of one embodiment of a PI CDR circuit when the reference clock signals are selected based on the incoming data phase.

FIG. 3A illustrates a phasor diagram 300 showing the operation of one embodiment of a PI CDR circuit when the reference clock signals are selected based on the incoming data phase. The phasor diagram 300 shows four quadrature clock signals, Clock I, Clock Q, Clock IB and Clock QB, which break the phasor diagram 300 into four quadrants. On the phasor diagram 300, Clock Q may have a phase angle of $\pi/2$, Clock IB may have a phase angle of $\pi$, Clock QB may have a phase angle of $3\pi/2$ and Clock I may have a phase angle of $2\pi$. When Clocks I and Q are used as the reference clocks for phase interpolation, then the initial edge of the resulting interpolated clock may have a phase angle of phase position 304, roughly between Clocks I and Q. When the phase of the incoming data stream is in Quadrant I, this may result in a relatively fast locking time. In the example shown in FIG. 3A, however, the incoming data stream phase position 302 is shown in Quadrant III. This requires the interpolated clock phase to be incrementally moved from phase position 304 to phase position 302 along line 308.

Instead of always using Clocks I and Q as reference clocks, various embodiments may detect the incoming data stream phase 302 and select a reference clock or clocks accordingly. For example, the quadrant of the incoming data stream phase may be detected, and the clock signal bounding the quadrant may be used as reference clock signals for phase interpolation. For example, because the example incoming data stream phase position 302 is in Quadrant III, Clocks IB and QB may be selected as reference clocks for phase interpolation. The resulting initial interpolated clock edge may then be at phase position 306. Because the path 310 between the second interpolated clock phase position 306 and the incoming data stream phase 302 is much shorter than the line 308, the locking time may also be shorter.

In some embodiments, instead of being placed within a quadrant, the incoming data stream phase position 302 may be placed to the nearest octant, where the octants represent eight equidistant vectors on the phasor diagram 300. FIG. 3B illustrates one embodiment of the phasor diagram 300 showing Octants 1-8. Each octant may correspond to a different phase interpolation reference clock or set of reference clocks. For example, when an incoming data stream phase falls nearest to Octant 2, Clocks I and B may be used as reference clocks. Likewise, Octant 4 may correspond to Clocks Q and IB; Octant 6 may correspond to Clocks IB and QB; and Octant 8 may correspond to Clocks I and QB. According to various embodiments, when an incoming data stream falls nearest to an Octant in the same direction as a clock, then that clock may be used as a sole reference clock for phase interpolation. For example, Octant 1 may correspond to Clock I; Octant 3 may correspond to Clock Q; Octant 5 may correspond to Clock IB; and Octant 7 may correspond to Clock QB. Although the embodiments herein are illustrated with four potential reference clocks and either four or eight possible reference clock combinations, it will be appreciated that any suitable number of clocks may be used, and that the number of potential reference clock combinations may vary based on the number of clocks.

Figure 4:
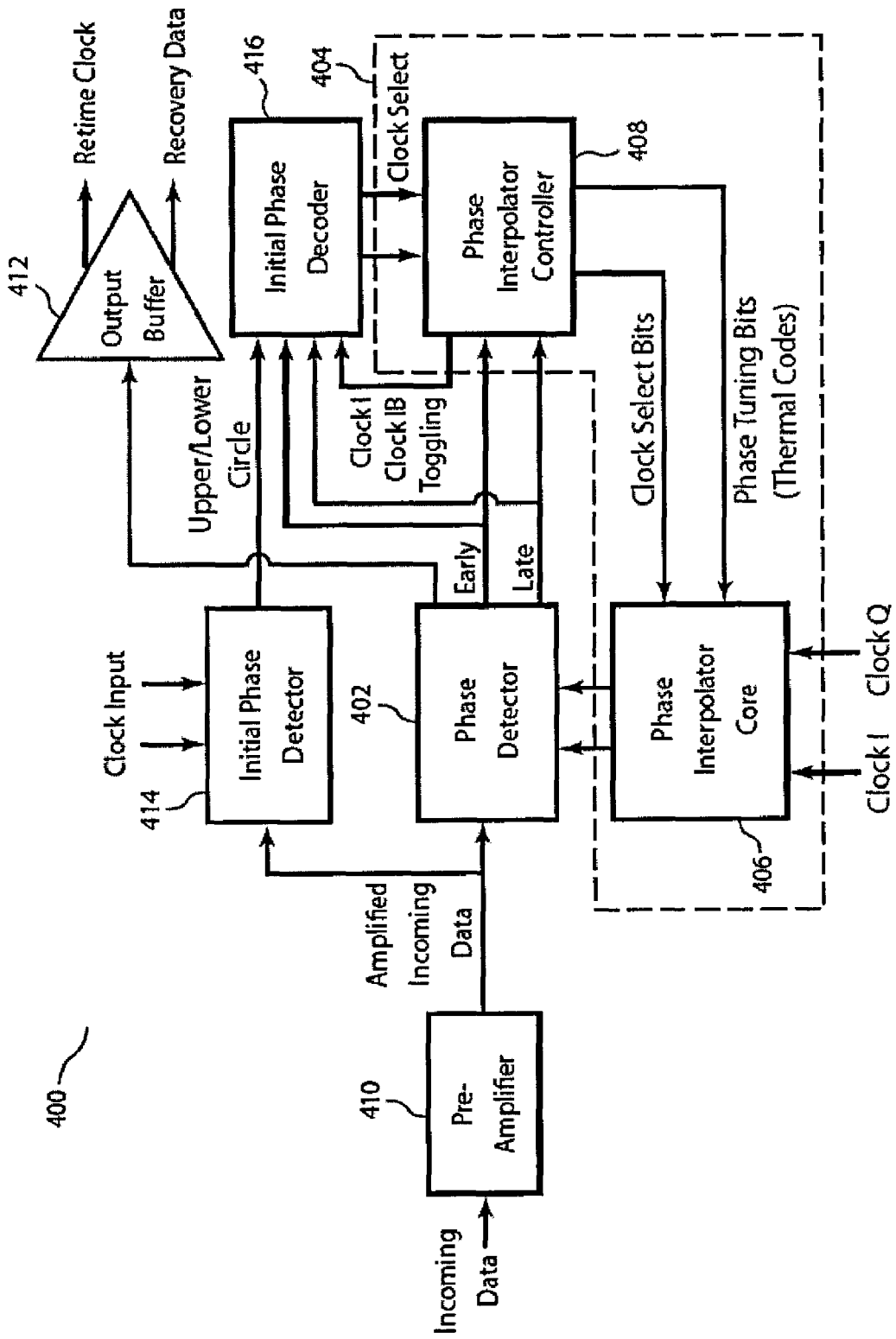
FIG. 4 illustrates a block diagram of one embodiment of a PI CDR circuit configured to select reference clocks considering the phase of an incoming data stream.

FIG. 4 illustrates a block diagram of one embodiment of a PI CDR circuit 400 configured to select reference clocks considering the phase of an incoming data stream. The circuit 400 may comprise a binary phase detector 402 and a phase interpolator 404. The phase interpolator 404 may include a phase interpolator controller 408 and a phase interpolator core 406. In addition to these components, the circuit 400 may also comprise an initial phase detector 414 and an initial phase decoder 416. Other components (e.g., preamplifier 410 and output buffer 412) may be utilized to condition the input and output of the circuit 400.

The initial phase detector 414 may receive the incoming data stream and derive data indicating the data stream's phase. The initial phase decoder 416 may receive data indicating the data stream's phase from the initial phase detector 414 and/or from other components of the circuit 400, and may select a reference clock or clocks. The identity of the selected reference clock or clocks may be provided to the phase interpolator 404 via the phase interpolator controller 408, as shown, or via the phase interpolator core 406. According to various embodiments, the initial phase detector 414 and initial phase decoder 416 may be active only until reference clock signals are selected, at which point the components 414, 416 may be deactivated (e.g., powered down, switched out of the circuit 400, etc.).

When a new incoming data stream is received by the circuit 400, the initial phase detector 414 and initial phase decoder 416 may be active. The incoming data stream may be provided to the binary phase detector 402 and initial phase detector 414 (e.g., via preamplifier 410). The binary phase detector 402 may comprise any suitable digital or analog circuit type for receiving the incoming data stream and an interpolated clock and outputting early and late values. For example, the binary phase detector 402 may assert the early value if the phase of the incoming data is early relative to the interpolated clock and may assert the late value if the phase of the incoming data is late relative to the interpolated clock. The initial interpolated clock signal may be set to any suitable value and, in various embodiments, may be set to the Clock Q.

Figure 5:
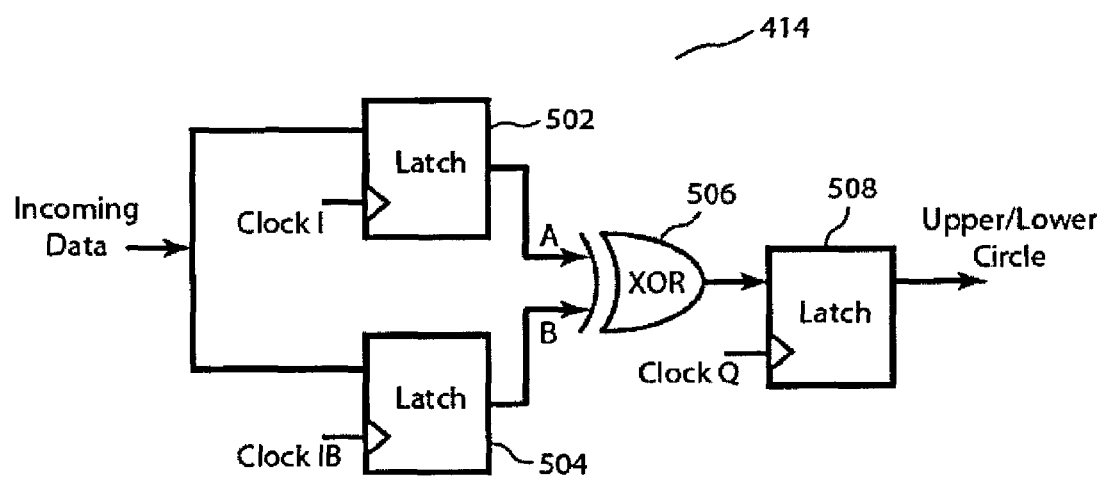
FIG. 5 illustrates a block diagram showing one embodiment of the initial phase detector circuit.

The initial phase detector 414 may comprise any suitable digital or analog circuit type for receiving the incoming data stream and outputting data indicating the phase of the incoming data stream. FIG. 5 illustrates a block diagram showing one embodiment of the initial phase detector 414. In the embodiment shown, the initial phase detector 414 provides as output an Upper/Lower Circle value, which may indicate that the phase of the incoming data stream is in an upper half 312 or a lower half 314 of the phasor diagram 300.

Figure 6:
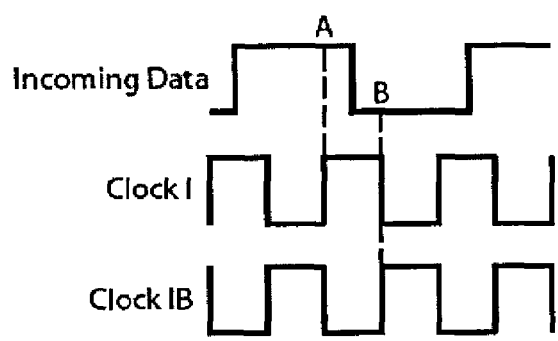
FIG. 6 illustrates waveforms generated by one embodiment showing a change in the state of the incoming data stream between the Clock I and the Clock IB.
Figure 7:
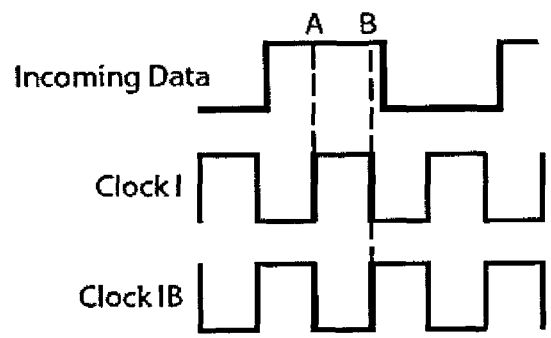
FIG. 7 illustrates one embodiment of the phasor diagram of FIG. 3 showing eight octants.

As shown in FIG. 5, the incoming data stream may be latched with Clock I at latch 502. The result may be a value A, representing the state of the incoming data stream on the rising edge of Clock I. At latch 504, the incoming data stream may be latched with Clock IB, resulting in a value B, representing the state of the incoming data stream on the rising edge of Clock IB. FIG. 6 illustrates waveforms generated by one embodiment showing a change in the state of the incoming data stream between the Clock I and the Clock IB. Such a change may indicate that the phase of the incoming data stream is in an upper half 312 of the phasor diagram 300. FIG. 7 illustrates waveforms generated by one embodiment showing no change in the state of the incoming data stream between Clock I and Clock IB. This may indicate that the phase of the incoming data stream is in the lower half 314 of the phasor diagram 300.

Referring again to FIG. 5, the Upper/Lower Circle value may be found by taking an exclusive OR of the values A and B at gate 506. The result may be latched to Clock Q at latch 508, generating the Upper/Lower Circle value. If the Upper/Lower Circle value is asserted, it may indicate that the incoming data phase is in the upper half 312 of the phasor diagram 300. If the Upper/Lower Circle value is unasserted, it may indicate that the incoming data phase is in the lower half 314 of the phasor diagram 300.

According to various embodiments, the initial phase detector 414 may also include components for calculating other values tending to indicate the phase of the incoming data stream. For example, the initial phase detector 414 may also include components for determining whether the phase of the incoming data stream toggles between Clocks I and IB (I/IB Toggle). This may indicate whether the phase of the incoming data stream is in the left half 316 or the right half 318 of the phasor diagram 300. The phase initial phase detector 414 may include any suitable components for finding I/IB Toggle. For example, a circuit similar to that shown in FIG. 5 may be used to determine whether there is any change in the state of the incoming data stream between the rising edges of Clocks Q and QB. In some embodiments, the I/IB Toggle value may be determined by components other than the initial phase detector 414, including, for example, the phase interpolator controller 408.

The initial phase decoder 416 may receive inputs indicating the phase of the incoming data stream from the initial phase detector 414 and/or from other circuit components. From these inputs, the decoder 416 may derive the reference clock or clocks to be provided to the phase interpolator 404. Any combination of inputs may be used. According to various embodiments, however, the inputs to the initial phase decoder 416 may include the I/IB Toggle value, the Upper/Lower Circle value, and the early and late values generated by the binary phase detector 402. Table 1 below shows a truth table showing inputs and outputs of one embodiment of the initial phase detector 414:

TABLE 1

| Inputs | | | Outputs | |
|---|---|---|---|---|
| Accumulated Upper/Lower Circuit Value | I/IB Toggle | Early/Late At Third Transition | Octant | Reference Clock(s) For Phase Interpolation |
| UUU | 0 | E | 4 | IB/Q |
| UUU | 0 | L | 2 | I/Q |
| UUU | 1 | — | 3 | —/Q |
| LLL | 0 | E | 6 | IB/QB |
| LLL | 0 | L | 8 | I/QB |
| LLL | 1 | — | 7 | —/QB |
| UUL/ULL | — | E | 5 | IB/— |
| UUL/ULL | — | L | 1 | I/— |

Figure 8:
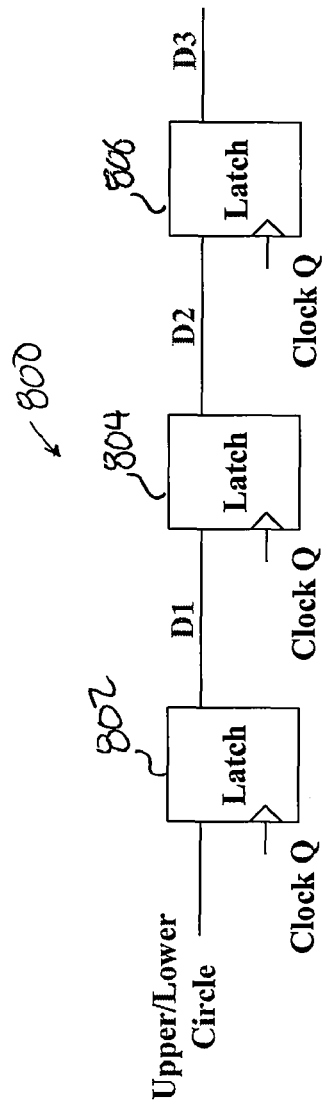
FIG. 8 illustrates one embodiment of a memory circuit for latching values of an Upper/Lower Circle value.

According to various embodiments, some of the inputs to the initial phase decoder 416 may be latched to provide accumulated values over time. For example, as shown in Table 1, the Upper/Lower Circle value values may be accumulated over several clock values. Although Table 1 illustrates an embodiment where values are accumulated over three clock values, it will be appreciated that any odd number of clock values may be used. FIG. 8 illustrates one embodiment of a memory circuit 800 for latching values of the Upper/Lower Circle value. The memory circuit 800 may be a part of the initial phase decoder 416. The Upper/Lower Circle value may be provided to latch 802, which may be serially connected to latches 804 and 806. All of latches 802, 804 and 806 may be clocked by a reference clock, which in this example is Clock Q. Accordingly, the values D3, D2 and D1 may represent values of the Upper/Lower Circle value at the three most recent rising edges of the reference clock.

Figure 9:
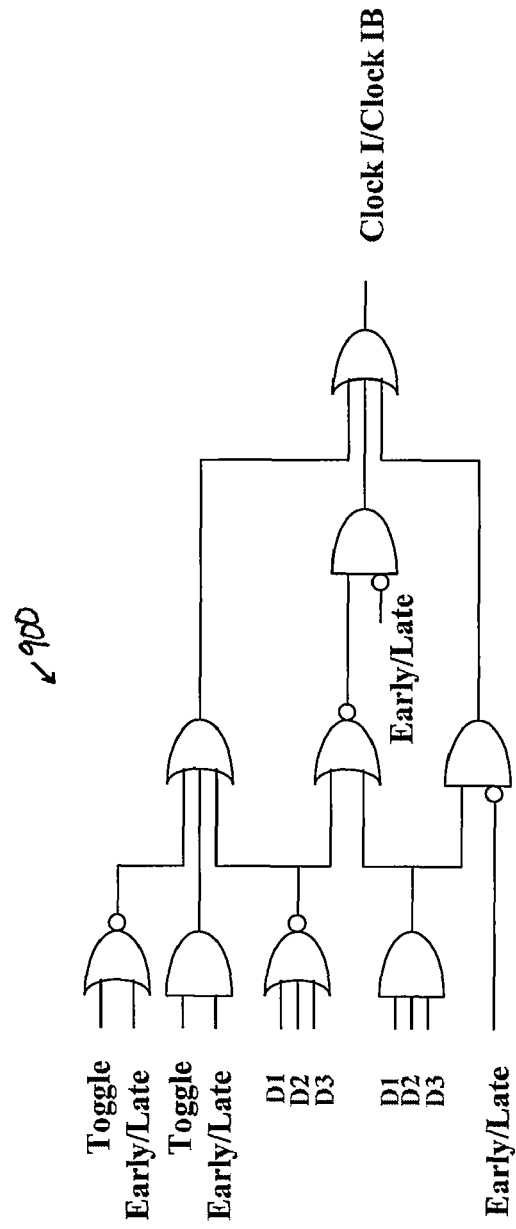
FIGS. 9 and 10 illustrate diagrams showing one embodiment of combinatory logic for implementing an initial phase decoder.
Figure 10:
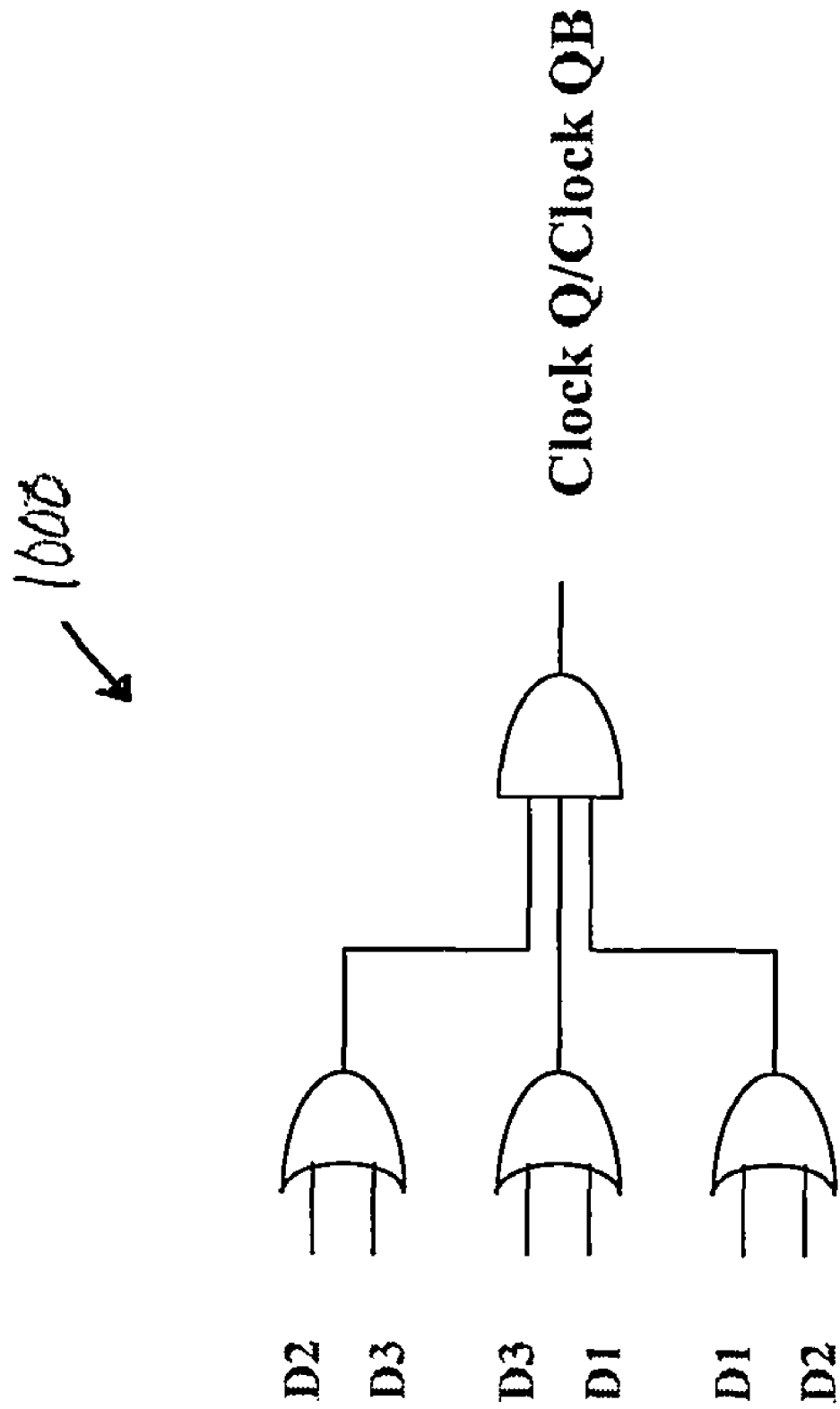

FIGS. 9 and 10 illustrate diagrams showing one embodiment of combinatory logic 900 and 1000 for implementing an initial phase decoder 416. Logic 900 may receive as inputs the I/IB Toggle value, a binary early/late value from the binary phase detector 402 and/or the accumulated Upper/Lower Circle values. The output of the logic 900 may be a value indicating whether Clock I or Clock IB is to be used as a reference clock by the phase interpolator 404. Logic 1000 may receive as inputs the accumulated Upper/Lower Circle values and provide as output a value indicating whether Clock Q or Clock QB will be used as a reference clock by the phase interpolator 404.

In various examples herein, components of the circuit 400 are implemented utilizing latches and combinatory logic. It will be appreciated that the functionality of the circuit 400 and of its various components may be implemented using any suitable kind of hardware and/or software. For example, various components, may be implemented utilizing any suitable software, microprocessor or state-machine based approach. Also, it will be appreciated that some or all of the circuit 400 may be implemented with analog circuits, including, for example, the binary phase detector 402 and/or the phase interpolator controller 408.

While several embodiments have been described, it should be apparent, however, that various modifications, alterations and adaptations to those embodiments may occur to persons skilled in the art with the attainment of some or all of the advantages of the embodiments. For example, according to various embodiments, a single component may be replaced by multiple components, and multiple components may be replaced by a single component, to perform a given function or functions. Also, circuit components described herein may be replaced with various equivalent circuit components. For example, the latches described herein may be replaced with flip-flops or any other suitable device. In addition, the polarity of various circuit values may be reversed. For example, to say that a value or value is "asserted" may indicate that it is at a higher or a lower potential relative to an unasserted bit or value, depending on circuit configuration. This application is therefore intended to cover all such modifications, alterations and adaptations without departing from the scope of the appended claims.

The embodiments are not to be construed as limited to the particular embodiments disclosed. The embodiments are therefore to be regarded as illustrative rather than restrictive. Variations and changes may be made by others without departing from the scope of the claims. Accordingly, it is expressly intended that all such equivalents, variations and changes that fall within the scope of the claims be embraced thereby.

In summary, numerous benefits have been described which result from employing the concepts described herein. The foregoing description of the one or more embodiments has been presented for purposes of illustration and description. It is not intended to be exhaustive or limiting to the precise form disclosed. Modifications or variations are possible in light of the above teachings. The one or more embodiments were chosen and described in order to illustrate principles and practical application to thereby enable one of ordinary skill in the art to utilize the various embodiments and with various modifications as are suited to the particular use contemplated. It is intended that the claims submitted herewith define the overall scope.

What is claimed is:

1. A clock data recovery system comprising:
a phase detector configured to receive an incoming data stream and an interpolated clock signal and output an early/late value indicating whether the incoming data stream is early or late relative to the interpolated clock signal;
a phase interpolator configured to receive the early/late signal and at least one reference clock signal and generate an interpolated clock signal considering the early/late value and the at least one reference clock signal;
an initial phase detector configured to receive the incoming data stream and output first data indicating a phase of the incoming data stream;
an initial phase decoder configured to receive data indicating a phase of the incoming data stream and select the at least one reference clock signal from a plurality of clock signals considering the data indicating a phase of the incoming data stream, the initial phase decoder being further configured to derive an estimation of the phase of the incoming data stream and select the at least one reference clock signal considering the estimation, wherein the data indicating the phase of the incoming data stream comprises the first data; and
wherein the initial phase detector and the initial phase decoder are configured to deactivate after the at least one reference clock signal is selected,
wherein the plurality of clock signals comprises a Clock Q signal with a phase angle of $\pi/2$, a Clock IB signal with a phase angle of $\pi$, a Clock QB signal with a phase angle of $3\pi/2$, and a Clock I with a phase angle of $2\pi$, and
wherein the estimation of the phase of the incoming data stream comprises a quadrant, and wherein the at least one reference clock signal comprises two clock signals bounding the quadrant.

2. The system of claim 1, wherein the phase interpolator circuit comprises:
a phase interpolator controller for receiving the early/late signal and generating a phase interpolator control signal; and
a phase interpolator core for receiving the interpolator control signal and generating the interpolated clock signal considering the interpolator control signal.

3. The system of claim 1, wherein the estimation of the phase of the incoming data stream comprises a quadrant of the phase of the incoming data stream.

4. The system of claim 1, wherein the estimation of the phase of the incoming data stream comprises an octant of the phase of the incoming data stream.

5. The system of claim 1, wherein the estimation of the phase of the incoming data stream comprises a nearest octant, wherein if the nearest octant falls between two of the plurality of clock signals, then the at least one reference clock signal comprises the two of the plurality of clock signals, and wherein if the nearest octant falls on one of the plurality of clock signals, the at least one reference clock signal consists of the one of the plurality of clock signals.

6. The system of claim 1, wherein the system comprises at least one circuit type selected from the group consisting of a microprocessor, a state machine, and combinatory logic.

7. The system of claim 1, wherein the data indicating the phase of the incoming data stream comprises data saved from a plurality of cycles of a first clock signal selected from the plurality of clock signals.

8. The system of claim 7, wherein the plurality of cycles is equal to three.

9. A hardware implemented method of clock data recovery, the method comprising:
receiving an incoming data stream;
generating an early/late value indicating whether the incoming data stream is early or late relative to an interpolated clock signal;
deriving from the incoming data stream first data indicating a phase of the incoming data stream;
selecting at least one reference clock signal from a plurality of clock signals considering the first data, wherein the plurality of clock signals comprises a Clock Q signal with a phase angle of $\pi/2$, a Clock IB signal with a phase angle of $\pi$, a Clock QB signal with a phase angle of $3\pi/2$, and a Clock I with a phase angle of $2\pi$;
generating an interpolated clock signal considering the at least one reference clock signal, and the early/late value;
deactivating at least one hardware component configured to derive the first data and at least one hardware component configured to select the at least one reference clock signal;
deriving an estimation of the phase of the incoming data stream, wherein the estimation of the phase of the incoming data stream comprises a quadrant; and
selecting the at least one reference clock signal considering the estimation, wherein the at least one reference clock signal comprises two clock signals bounding the quadrant.

10. The method of claim 9, wherein the estimation of the phase of the incoming data stream comprises a quadrant of the phase of the incoming data stream.

11. The method of claim 9, wherein the estimation of the phase of the incoming data stream comprises an octant of the phase of the incoming data stream.

12. The method of claim 9, wherein the estimation of the phase of the incoming data stream comprises a nearest octant, wherein if the nearest octant falls between two of the plurality of clock signals, then the at least one reference clock signal comprises the two of the plurality of clock signals, and wherein if the nearest octant falls on one of the plurality of clock signals, the at least one reference clock signal consists of the one of the plurality of clock signals.

13. The method of claim 9, wherein the data indicating the phase of the incoming data stream comprises data saved from a plurality of cycles of a first clock signal selected from the plurality of clock signals.

14. The method of claim 13, wherein the plurality of cycles is equal to three.

* * * * *